United States Patent [19]
Hinze

[11] Patent Number: 6,012,223
[45] Date of Patent: Jan. 11, 2000

[54] PROCESS FOR STRUCTURALLY SECURING STICK-LEADED COMPONENTS TO A CIRCUIT BOARD

[75] Inventor: Lee R. Hinze, Kokomo, Ind.

[73] Assignee: Delco Electronics Corp., Kokomo, Ind.

[21] Appl. No.: 09/127,290

[22] Filed: Jul. 31, 1998

[51] Int. Cl.$^7$ ..................................................... H05K 3/30
[52] U.S. Cl. .............................. 29/837; 29/843; 174/260; 174/267
[58] Field of Search .............................. 29/837, 843, 839, 29/840, 841, 741; 174/260, 267

[56] References Cited

U.S. PATENT DOCUMENTS

| | | | |
|---|---|---|---|
| 3,159,906 | 12/1964 | Telfer ........................................ | 29/843 |
| 3,184,830 | 5/1965 | Lane et al. .................................. | 29/843 |
| 5,703,754 | 12/1997 | Hinze ....................................... | 361/763 |
| 5,839,189 | 11/1998 | Pomeroy et al. ...................... | 29/837 X |

Primary Examiner—Carl J. Arbes
Attorney, Agent, or Firm—Jimmy L. Funke

[57] ABSTRACT

A process for mounting a surface-mount component(12), such as a stick-leaded device, to a circuit board (10) having a pair of plated through-holes and at least one additional through-hole (20), each of which extends through the circuit board (10). The leads (16) of the component (12) are then inserted into the plated through-holes so as to position the component (12) on a first side of the circuit board (10), after which a material (14) is applied to the second (opposite) side of the circuit board (10) so that the material (14) flows through the second through-hole (20), contacts the component (12), and bonds the component (12) to the first side of the circuit board (10). For this purpose, the material (14) preferably contacts the entire surface (18) of the component (12) facing a near surface region of the circuit board (10) and bonds the component surface (18) to the surface region.

13 Claims, 1 Drawing Sheet

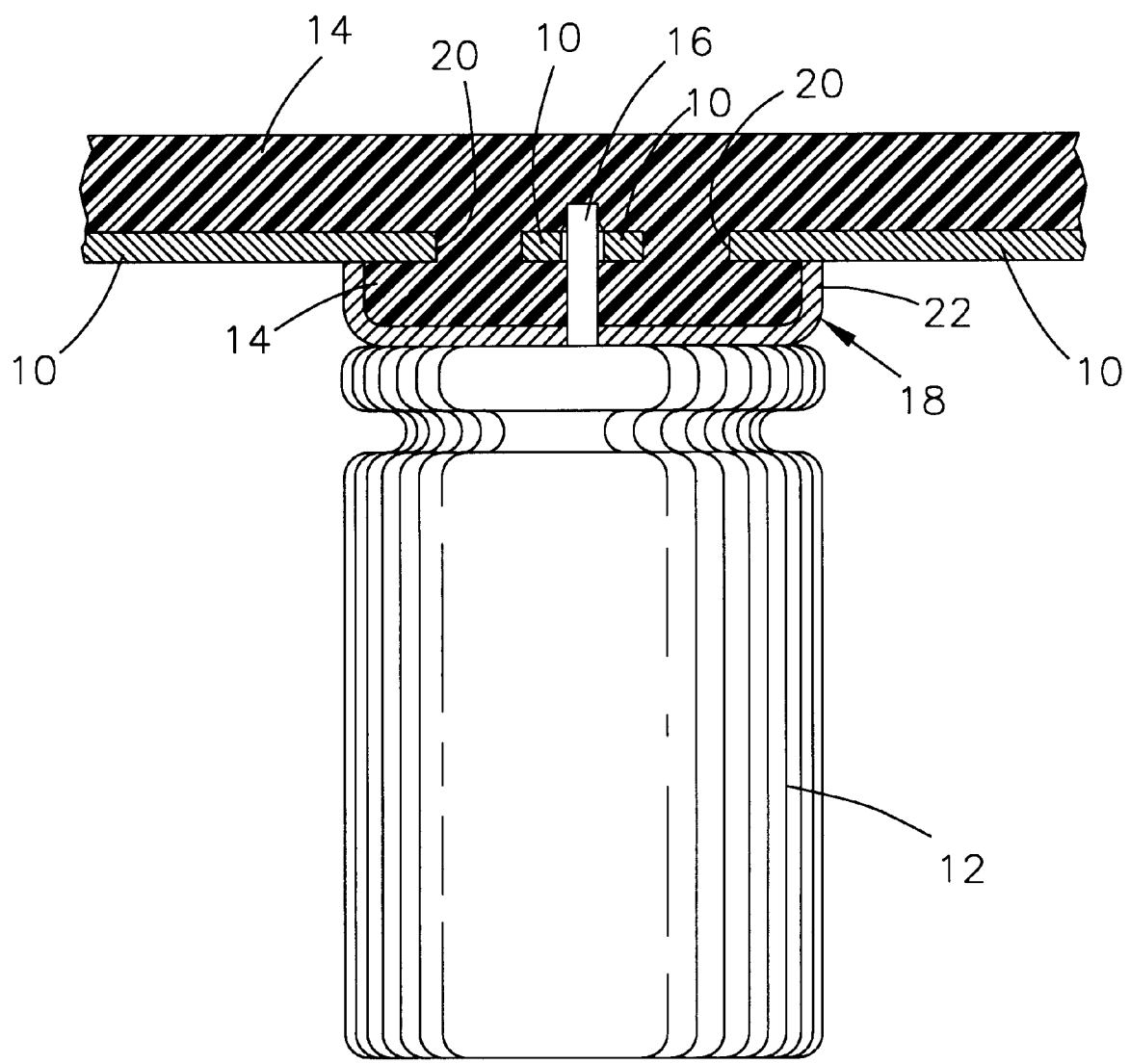

PROCESS FOR STRUCTURALLY SECURING STICK-LEADED COMPONENTS TO A CIRCUIT BOARD

FIELD OF THE INVENTION

The present invention generally relates to stick-leaded electronic devices. More particularly, this invention relates to a method for structurally securing a stick-leaded device using a material that structurally bonds the device to promote resistance to fatigue fracturing of the leads when subjected to vibration.

BACKGROUND OF THE INVENTION

Stick-leaded circuit board components such as electrolytic capacitive devices are typically secured to circuit boards by soldering their leads or sticks to plated through-holes in a circuit board. The plated through-holes serve to electrically interconnect the component to metallization (e.g., metal runners) on the opposite side of the board, forming a side-to-side connection. Soldering is performed by such methods as wave soldering by which solder is applied to the leads of a component from the side of the circuit board opposite the component. However, the solder joint alone often does not sufficiently prevent fatigue fracturing of the leads when the circuit board is subjected to vibration. In the past, conformal coatings applied to circuit boards to prevent the accumulation of moisture on the boards have also served to reduce fatigue fracturing of stick leads by acting as bonding and structural damping agents. However, conformal coatings are not always appropriate or possible, rendering stick-leaded components vulnerable to detachment from a circuit board.

Accordingly, it would be desirable if a technique were available to provide vibrational damping for surface-mount devices, and particularly stick-leaded devices, that did not complicate the manufacture or processing of the devices and their circuit boards.

SUMMARY OF THE INVENTION

It is an object of this invention to provide a process for structurally securing a stick-leaded device to a circuit board.

It is a further object of this invention that such a process is uncomplicated and does not require additional components or complicated process steps.

It is another object of this invention that such a process is capable of bonding a stick-leaded device to a circuit board in a manner that provides vibrational damping for the device.

It is another object of this invention to provide a circuit board having a stick-leaded device attached in accordance with the process of this invention.

In accordance with a preferred embodiment of this invention, these and other objects and advantages are accomplished as follows.

According to the present invention, there is provided a process for mounting a component, such as a stick-leaded device, to a circuit board having at least one and typically two plated through-holes and at least an additional through-hole, all of which extend through the circuit board. The leads of the component are then inserted into the plated through-holes to position the component on a first side of the circuit board, after which a material is applied to the second (opposite) side of the circuit board so that the material flows through the additional through-hole, contacts the component, and bonds the component to the first side of the circuit board. For this purpose, the material preferably contacts the entire surface of the component facing a near surface region of the circuit board and bonds the component surface to the surface region.

In the above process, the component can be attached to the circuit board by wave soldering prior to application of the material. The material is preferably a curable composition that is cured to form a strong bond between the component and circuit board. If applied to cover substantially all of the second side of the circuit board, the material can also be used to mount and bond the circuit board to a support, such as an electronic module housing.

As described above, the process of this invention yields a circuit board having a stick-leaded device that is not only reliably secured, but is also highly resistance to vibrational fatigue that would otherwise lead to fatigue fracturing of the component lead. Those skilled in the art will appreciate that the process described above is not complicated, does not require additional parts such as support clips, and does not entail unusual, complicated or expensive process steps, but instead can make use of materials and processes available in the electronic industry.

Other objects and advantages of this invention will be better appreciated from the following detailed description.

BRIEF DESCRIPTION OF THE DRAWINGS

The present invention will now be described, by way of example, with reference to the accompanying drawings, in which the lone FIGURE is a side cross-sectional view of a stick-leaded electrolytic capacitor mounted to a circuit board in accordance with the present invention.

DETAILED DESCRIPTION OF THE INVENTION

The FIGURE shows a stick-leaded component 12 mounted to a circuit board 10 of any suitable construction, such as a fiberglass laminate board. The component 12 portrayed is an electrolytic capacitor, though other types of surface-mount devices can benefit from the present invention. A notable application for the circuit board assembly represented in the FIGURE is a sensing and diagnostic module for automotive applications, such as an automotive air bag controller. However, those skilled in the art will appreciate that the invention has a wide range of applications in which stick-leaded and other surface-mount devices are subject to vibration.

As represented in the FIGURE, the component 12 is mounted to the circuit board 10 by inserting each of its two leads 16 through a corresponding pair of plated through-holes in the circuit board 10. The leads 16 (one of which is directly behind the other in the FIGURE) are electrically connected to their respective plated through-holes with solder that may be applied by such known methods as wave soldering. Alone, the solder is insufficient to reliably secure the component 12 to the circuit board 10 in applications where the board 10 is subjected to a significant level of vibration, such as that found in the passenger compartment of an automobile. According to the invention, vibrational damping of the component 12 is achieved by the application of a material 14 to the surface of the circuit board 10 opposite the component 12. More particularly, through-holes 20 (two are shown in the FIGURE) are provided in the circuit board 10 adjacent the plated through-holes, and the material 14 is applied such that it flows through the through-holes 20 and contacts the surface of the component 12 nearest the circuit board 10.

Preferably, the size and number of holes 20 are chosen to ensure that a sufficient quantity of the material 14 flows through the holes 20 to fill a gap created between the circuit board 10 and component 12 by stand-offs 22 that extend roughly parallel to the leads 16 from the end seal 18 of the component 12. The stand-offs 22 are preferably slotted or otherwise have openings that allow air within the gap to escape as the material 14 fills the gap. The through-holes 20 are shown in the FIGURE as being oppositely disposed from each other relative to an axis through the two leads 16 of the component 12, which promotes the ability of the material 14 to completely fill the gap. In doing so, the material 14 is able to more fully contact the end seal 18 of the component 12 and the adjacent surface of the circuit board 10. As a result, the bond strength and damping effect of the material 14 are promoted.

According to the invention, suitable compositions for the material 14 include electrically-nonconductive potting compounds of the type known in the art to pot an electronic device or sensing element in an open container. Suitable potting materials include heat-curable urethanes and polybutadiene urethanes, a preferred example of the latter being disclosed in U.S. Pat. No. 5,185,498 to Sanftleben et al., assigned to the assignee of this invention. The two components of the polybutadiene urethane potting material disclosed by Sanftleben et al. are commercially available under the names U510S and UH510S from the P.D. George Co. of St. Louis, Mo. It is foreseeable that a wide variety of curable compounds could be used as the material 14 of this invention.

Based on the above construction, the process for mounting the component 12 entails forming the plated through-holes and the two additional through-holes 20 by any suitable method. The leads 16 of the component 12 are inserted into the plated through-holes and then soldered to the through-holes such as by wave soldering in a known manner. The material 14 is then applied in a liquid state to the surface of the circuit board 10 opposite the component 12, such that the material 14 flows through the through-holes 20 and contacts both the component 12 and the adjacent surface region of the circuit board 10, as shown in the FIGURE. The material 14 then preferably undergoes an appropriate heat cure cycle, yielding a strong bond between the component 12 and the circuit board 10 that damps vibration transmitted to the component 12 via the board 10.

In a preferred embodiment represented in the FIGURE, the material 14 is applied to cover substantially the entire surface of the circuit board 10 opposite the component 12, and then used to mount and bond the circuit board 10 to a support 22, such as an electronic module housing. The process of this invention and its resulting circuit board assemblies of the type shown in the FIGURE have been determined to withstand the hostile thermal and vibrational environment within the passenger compartment of an automobile without fatigue fracturing the leads of stick-leaded components.

While the invention has been described in terms of a preferred embodiment, it is apparent that other forms could be adopted by one skilled in the art. Accordingly, the scope of the invention is to be limited only by the following claims.

What is claimed is:

1. A process for mounting a component to a circuit board, the process comprising the steps of:

providing a circuit board having a plated through-hole and at least a second through-hole extending through the circuit board from a first side thereof to a second side thereof;

inserting a lead of a component into the plated through-hole so as to position the component on the first side of the circuit board; and then applying an electrically-nonconductive polymeric material to the second side of the circuit board so that the material flows through the second through-hole, contacts the component, and bonds the component to the first side of the circuit board.

2. A process as recited in claim 1, wherein the component has a surface facing a surface region of the first side of the circuit board and wherein, during the applying step, the material contacts the surface of the component and the surface region.

3. A process as recited in claim 1, wherein the material is applied to cover substantially all of the second side of the circuit board.

4. A process as recited in claim 1, wherein the component is a stick-leaded component.

5. A process as recited in claim 1, wherein the component is an electrolytic capacitive surface-mount device.

6. A process as recited in claim 1, further comprising the step of wave soldering the second side of the circuit board after inserting the lead of the component into the plated through-hole and prior to applying the material to the second side of the circuit board.

7. A process as recited in claim 1, further comprising the step of curing the material after the step of applying the material to the second side of the circuit board.

8. A process as recited in claim 1, further comprising the step of mounting and bonding the circuit board to a support with the material.

9. A process as recited in claim 8, wherein the support is a housing of an automotive electronic module.

10. A structure formed by the process of claim 8.

11. A structure formed by the process of claim 1.

12. A process for mounting a stick-leaded component to a circuit board, the process comprising the steps of:

providing a circuit board having two plated through-holes and at least two additional through-holes extending through the circuit board from a first side thereof to a second side thereof;

inserting leads of a stick-leaded component into the plated through-holes so as to position the component on the first side of the circuit board;

wave soldering the second side of the circuit board so as to solder the leads to the plated through-holes;

applying an electrically-conductive heat-curable material to substantially all of the second side of the circuit board so that the material flows through the additional through-holes, contacts the component, fills a gap between the component and the circuit board, and bonds the component to the first side of the circuit board;

placing the circuit board against a support so that the material is between and contacts the circuit board and the support; and then curing the material to bond the circuit board to the support.

13. A structure formed by the process of claim 12.

* * * * *